United States Patent
Chu

(10) Patent No.: US 8,369,061 B2
(45) Date of Patent: Feb. 5, 2013

(54) ANTI-ESD ELASTIC PLATE AND DEVICE

(75) Inventor: Ping-Hsu Chu, Taipei (TW)

(73) Assignee: Inventec Corporation, Taipei (TW)

( * ) Notice: Subject to any disclaimer, the term of this patent is extended or adjusted under 35 U.S.C. 154(b) by 269 days.

(21) Appl. No.: 12/854,401

(22) Filed: Aug. 11, 2010

(65) Prior Publication Data

US 2011/0299215 A1  Dec. 8, 2011

(30) Foreign Application Priority Data

Jun. 8, 2010 (TW) ................................ 99118520 A

(51) Int. Cl.
*H01H 47/00* (2006.01)

(52) U.S. Cl. ....................................................... 361/220
(58) Field of Classification Search .................... 361/220
See application file for complete search history.

(56) References Cited

U.S. PATENT DOCUMENTS

| 5,537,294 | A | * | 7/1996 | Siwinski | 361/753 |
| 5,563,450 | A | * | 10/1996 | Bader et al. | 257/785 |
| 6,456,504 | B1 | * | 9/2002 | LoForte et al. | 361/799 |
| 6,853,560 | B2 | * | 2/2005 | Borcherding et al. | 361/809 |
| 7,489,284 | B2 | * | 2/2009 | Shih | 343/878 |
| 7,576,993 | B2 | * | 8/2009 | Hsieh et al. | 361/753 |
| 7,692,932 | B2 | * | 4/2010 | Bisbikis et al. | 361/799 |
| 2007/0052100 | A1 | * | 3/2007 | Bellinger | 257/758 |

FOREIGN PATENT DOCUMENTS

| TW | 450513 | 8/2001 |
| TW | 487304 | 5/2002 |

* cited by examiner

*Primary Examiner* — Ronald W Leja
(74) *Attorney, Agent, or Firm* — WPAT PC; Justin King

(57) ABSTRACT

The present invention provides an anti-ESD elastic plate comprising a first conducting part, and a pair of second conducting part. The first conducting part has at least one projection structure. The two second conducting parts are connected respectively to the two lateral sides of the first conducting part. Each of the second conducting part further has a second conducting element and a press element, whereas the second conducting element is configured with a second projection structure and the pressing element is disposed aside the second conducting element. In another embodiment, the present invention further provides an anti-ESD device for conducting ESD by arranging the anti-ESD elastic plate as a conducting medium that is disposed at the boundary between an opening of a housing and a cover for sealing the opening.

9 Claims, 7 Drawing Sheets

ANTI-ESD ELASTIC PLATE AND DEVICE

FIELD OF THE INVENTION

The present invention relates to an anti-ESD design, and more particularly, to an anti-ESD elastic plate and device that are provided for conducting ESD (electrostatic discharge).

BACKGROUND OF THE INVENTION

In the age of information, the ability to transmit and communicate information is the key to success in the fierce commercial competition. Therefore, along with the rapid development of technology, electronic devices with information processing ability, such as personal computer (PC), notebook computer, hand-held personal computer (HPC), personal digital assistant (PDA), etc., are becoming essential tools for business men all over the world Among those electronic devices, the notebook computers are especially being benefit by the recent advance in technology in that they are being built smaller and smaller. Thus, it is important for such small-sized electronic devices to have effective means for preventing being damaged by electrostatic discharge (ESD) since Electrostatic Discharge (ESD), being a sudden and momentary electric current that flows between two objects at different electrical potentials caused by direct contact with each other or induced by an electrostatic field, is one of the major cause of device failure. Static electricity is often generated through tribocharging that is the separation of electric charges that occurs when two materials are brought into contact and then separated. Moreover, it is noted that a person can get triboelectrically charged in a number of ways, even by just walking across a room while causing frictions between fabrics that are worn on the person. In addition, even the friction resulting from the flowing of airflow through the surface of an electronic device's outer shell can cause the electronic device to become triboelectrically charged that can lead to an ESD event. Thus, as ESD is known to be a serious issue that may cause damage to electronic devices, many ESD prevention circuits or components had already been developed.

One such conventional ESD prevention apparatus 1 is shown in FIG. 1. In FIG. 1, the ESD prevention apparatus 1 comprises: a housing 10 for a notebook computer, formed with an opening 100 that is sealed by a cover 11. It is noted that the opening 100 is provided for facilitating a user to replace any component in the notebook computer or for the maintenance of the notebook computer. Generally, the interior of the housing 10 is formed with a conductive layer 101 by coating or sputtering, by that the electrostatic charge, being build-up on the housing 10 and transferred to the conductive layer 101 through the heat-dissipating holes 12, is further being guided to a ground terminal.

However, since the conducting of the electrostatic charge is interrupted and broken at the interfacing between the opening 100 and the cover 11, conventionally for continuing the conduction there will be an anti-ESD plate 13 being arranged at the interfacing that is fixed on the housing 10 by the use of a heat fusion joint 14. Operationally, when the opening 100 is sealed by the cover 11, the conductive layer 110 of the cover 11 is electrically connected with the conductive layer 101 of the housing 10, and thereby, the electrostatic charge, being build-up on the cover 11 and transferred to its conductive layer 110 through the holes 111, is further being guided to the anti-ESD plate 1 where it is guided to the conductive layer 101 of the housing 10 and then finally to the ground terminal.

Although the conventional ESD prevention apparatus 1 shown in FIG. 1 is capable of preventing ESD from happening effectively, any failure or damage to the heat fusion joint 14 may cause the anti-ESD plate 13 to be separated from the housing 10 and fall inside the notebook computer that may cause the electronic devices inside the notebook computer or the motherboard thereof to burn-out. Therefor, it is in need of an improved anti-ESD plate and device for overcoming the aforesaid shortcoming.

Another such conventional ESD prevention apparatus is an anti-electromagnetic interference (EMI) plate, disclosed in TW. Pat. Pub. No. 450513. The foregoing plate, being configured with a first extension and a second extension that are interconnected with each other through the turning ends thereof, can be clamped an electronic device while enabling a contact part formed on the plate to engage with an EMI source for guiding the electromagnetic wave as well as the electrostatic discharge generated therefrom out of the electronic device.

One another conventional ESD prevention apparatus is an anti-EMI connecting plate, disclosed in TW. Pat. Pub. No. 487304. The foregoing connecting plate, being formed as a rectangle panel enclosed inside a U-shaped frame that have a plurality of raised fots formed on a outer side of the frame, can be inset into an opening of a back plate component while enabling the elastic plate extending out of the rim of the frame to engage tightly with the back plate component for achieving anti-EMI as well as anti-ESD effect.

SUMMARY OF THE INVENTION

In view of the disadvantages of prior art, the object of the present invention is to provide an anti-ESD plate, capable of being sliding and locked into a specific position on a side of an opening formed on a housing of an electronic device, so as to be used as conducting medium for conducting static electricity at the boundary between the opening and the cover. In addition to the ability to conduct static electricity effectively, the aforesaid anti-ESD plate can be assembled and fixed easily, by that not only the production yield is increased, but also the waste relating to manual cost can be reduced.

In an embodiment, the present invention provides an anti-ESD plate, comprising: a first conducting part, configured with at least one projection structure; and at least one second conducting part, each connected the first conducting part and having a second conducting element and a press element; wherein, each second conducting element is configured with a second projection structure; and each pressing element is disposed at a side its corresponding second conducting element.

In another embodiment, the present invention further provides an anti-ESD device, comprising: a housing, formed with a first surface and a second surface while enabling the second surface to be formed with a first conductive layer and at least one blocks, and the housing further having an opening formed thereon while enabling the opening to be formed with an protruding panel at a side thereof in a manner that the protruding panel is configured with two recesses at positions corresponding to the two sides thereof while having two fixing guides to be disposed respectively at the edges of the two recesses; an anti-ESD plate, configured with: a first conducting part, being arranged on the second surface while abutting against the protruding panel; at least one second conducting part, each connected to the first conducting part and being configured with a second conducting element and a press element; and a cover, having a second conductive layer formed on a surface thereof; wherein, the first conducting part is configured with at least one first projection structure that is arranged abutting against the first conductive layer; each second conducting element is further configured with a second projection structure in a manner that the second projection structure is arranged at a position corresponding to one of the two recesses; the press element is disposed at a side of the second conducting element while abutting against a side surface of the corresponding fixing guide so as to enable the anti-ESD plate to be fixed and positioned by the at least one block when the anti-ESD plate is disposed on the second surface; and the second conductive layer is enabled to contact with the second projection structure of the second conducting element when the cover is disposed at a position sealing the opening.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
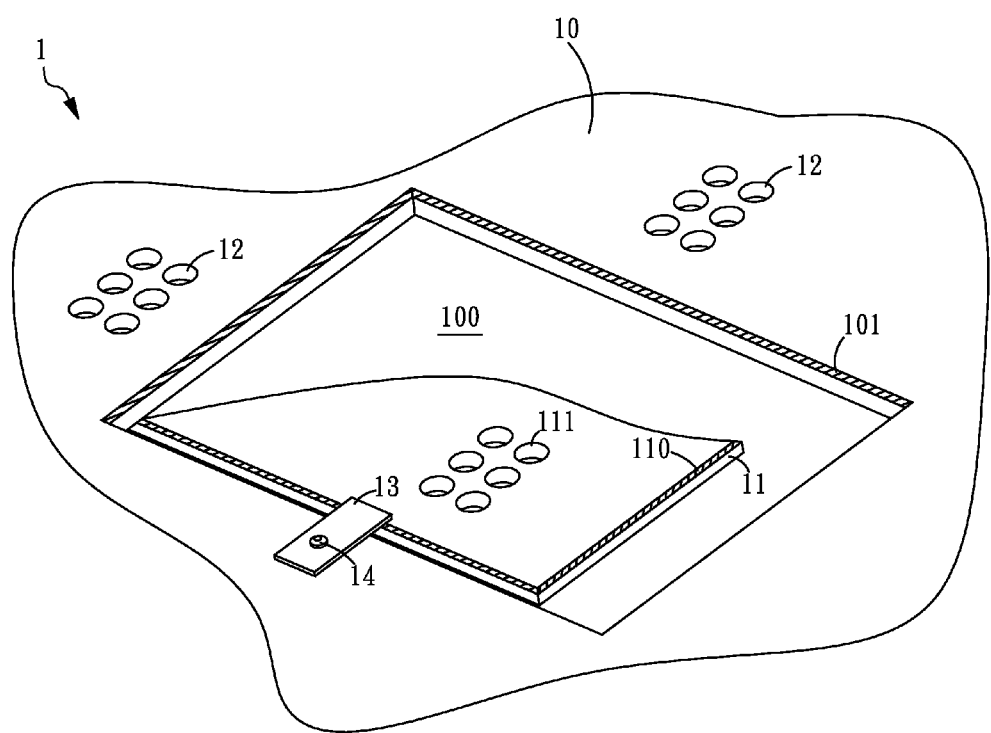
FIG. 1 is a schematic diagram showing a conventional anti-ESD device.
Figure 2A:
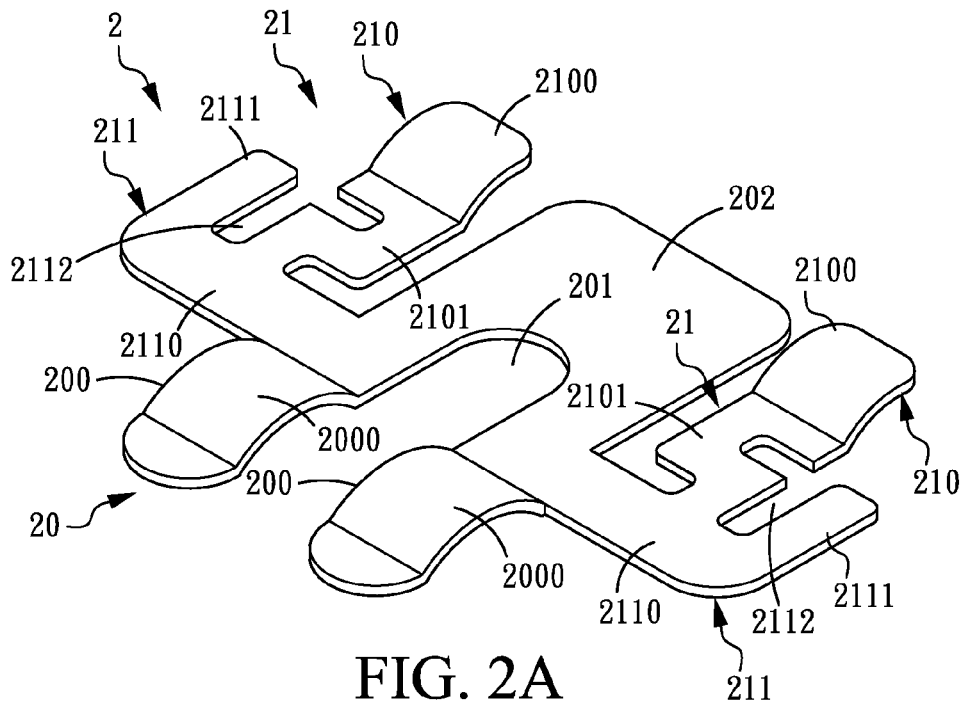
FIG. 2A and FIG. 2B are three-dimension diagrams showing an anti-ESD plate of different viewing angles according to an embodiment of the present invention.
Figure 2B:
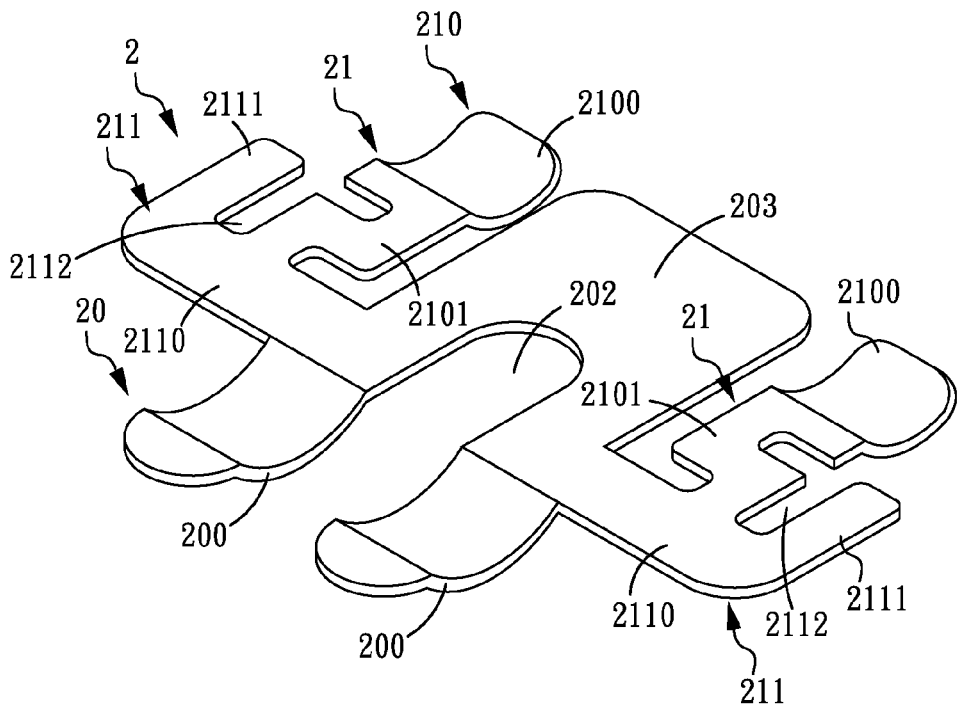

Please refer to FIG. 2A and FIG. 2B, which are three-dimension diagrams showing an anti-ESD plate of different viewing angles according to an embodiment of the present invention. In FIG. 2A and FIG. 2B, the anti-ESD plate 2 comprises: a first conducting part 20 and a pair of second conducting parts 21, in which the first conducting part 20 is configured with a slot 201 that is formed at a position for dividing the first conducting part 20 into a pair of first conducting elements 200, while enabling each first conducting element 200 to have one first projection structure 2000 formed thereon. In this embodiment, each first projection structure 2000 is a curved by a specific curvature. In addition, there is an protruding panel 202 formed at the rear of the slot 201. As for the pair of the second conducting parts 21, each of the two second conducting parts 21 is connected to a side of the first conducting part 20 and is configured with a second conducting element 210 and a press element 211. It is noted that each second conducting element 210 is formed with a second projection structure 2100, and each press element 211 is disposed at a side of its corresponding second conducting element 210 in a manner that the second conducting element 210 is sandwiched between the first conducting part 20 and the press element 211. Nevertheless, although there are two second conducting parts 21 in the aforesaid embodiment, there can be only one such second conducting part 21 in another embodiment that the number of the second conducting part 21 is not limited thereby.

Moreover, in the embodiment shown in FIG. 2A and FIG. 2B, each press element 211 is configured with a first panel 2110 and a second panel 2111, whereas the first panel 2110 is formed extending outwardly from a side of the first conducting part 20. In this embodiment, the first panel 2110 is connected to the first conducting part 20 at a position where the first conducting part 20 is connected with the protruding panel 202, but it is not limited thereby. On the other hand, the second panel 2111 is connected to an end of the first panel 2110 so as to form an accommodation space 2112 by the enclosure of the second panel 2111 and the first conducting part 20 to be used for receiving the corresponding second conducting part 210. In addition, in this embodiment, the second conducting part 210 is connected to a side of the first panel 2110 by the use of a cantilever 2101.

Figure 3A:
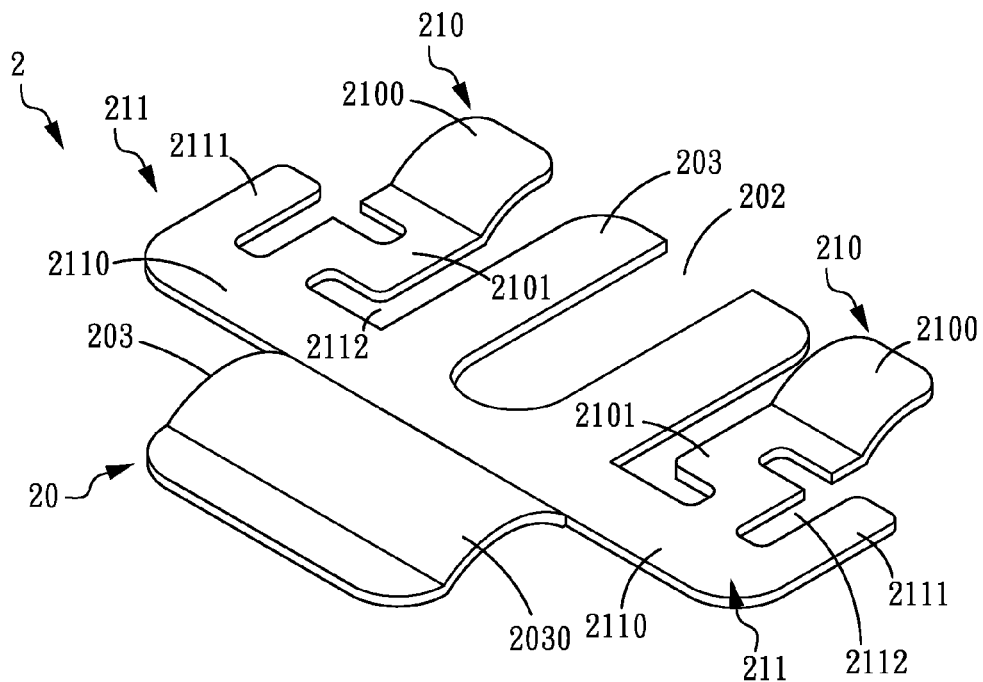
FIG. 3A to FIG. 3C are schematic diagrams showing three anti-ESD plates according to three different embodiments of the present invention.
Figure 3B:
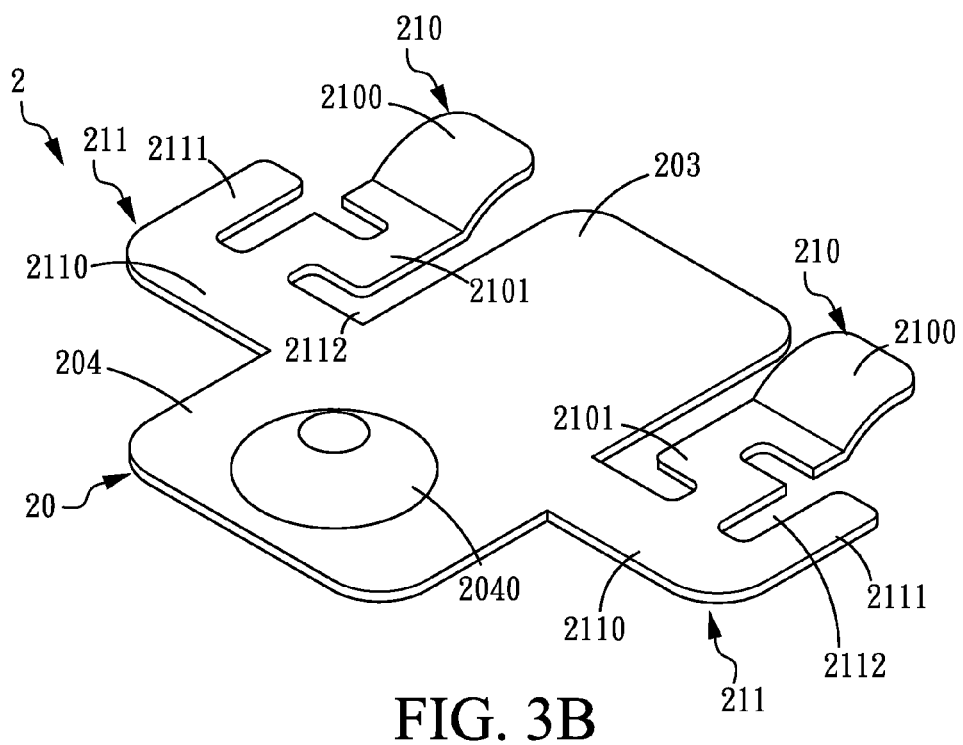
Figure 3C:
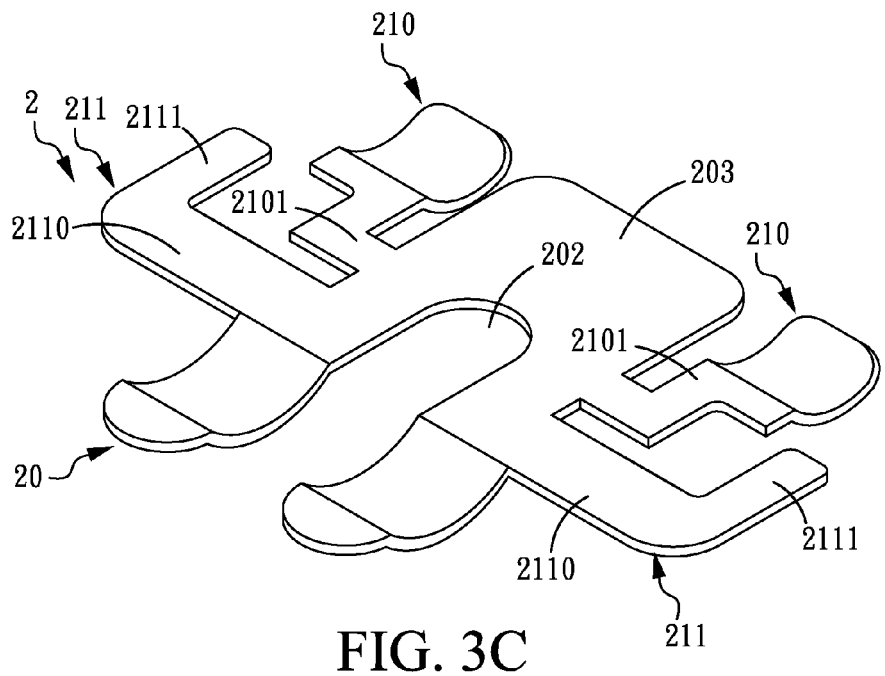

Please refer to FIG. 3A, which is a schematic diagram showing an anti-ESD plate according another embodiment of the present invention. The anti-ESD device 2 shown in FIG. 3A is structured similar to the one shown in FIG. 2A, but is different in that: the first conducting part 20 in FIG. 3A is composed of only one first conducting element 203 and thus it has only one first projection structure 2030. Therefore, it is noted that the amount of the first conducting element is not restricted to be two as that shown in FIG. 2A. Please refer to FIG. 3B, which is a schematic diagram showing an anti-ESD plate according further another embodiment of the present invention. In FIG. 3B, the slot 202 of FIG. 3A is opened to a direction opposite to that of the slot 202 shown in FIG. 2A; and the first conducting element 203 of the first conducting part 20 is structured as a flat panel having a protrusion 2040 formed thereon. In addition, in the embodiment shown in FIG. 3B, there is no slot being formed on the first conducting part 20, as those slots 202 shown in FIG. 2A and FIG. 3A. Please refer to FIG. 3C, which is a schematic diagram showing an anti-ESD plate according one further embodiment of the present invention. The anti-ESD device 2 shown in FIG. 3C is structured similar to the one shown in FIG. 2A, but is different in that: the second conducting part 210 is connected directly with the first conducting part 20 in a manner that the second conducting part 210 is connected with the first conducting element 203 of the first conducting part 20 by the use of a cantilever 2101.

Figure 4A:
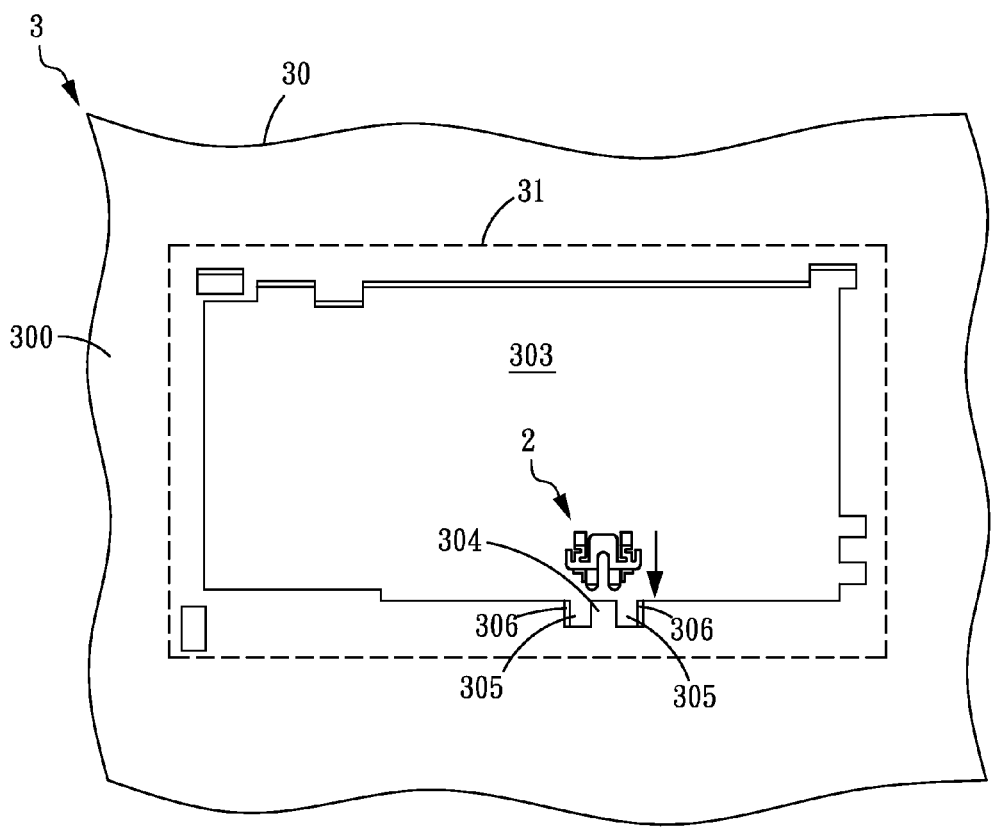
FIG. 4A and FIG. 4B are schematic diagrams showing an anti-ESD device of the present invention.
Figure 4B:
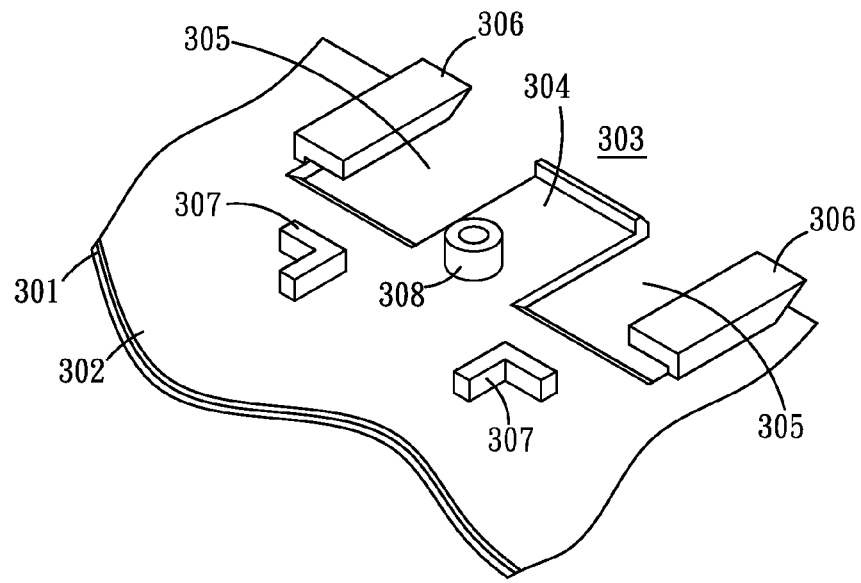

Please refer to FIG. 4A and FIG. 4B, which are schematic diagrams showing an anti-ESD device of the present invention. In FIG. 4A and FIG. 4B, the anti-ESD device 3 comprises a housing 30, an anti-ESD plate 2 and a cover, in which the housing 30 is formed with a first surface 300 and a second surface 301 while enabling the second surface 301 to be formed with a first conductive layer 302. It is noted that the first conductive layer 302, being a thin conductive metal layer, is formed on the second surface 302 by coating or sputtering. In this embodiment, the housing 30 is substantially a housing for a notebook computer, but is not limited thereby. As shown in FIG. 4B, and the housing 30 further has an opening 303 formed thereon while enabling the opening 303 to be formed with an protruding panel 304 at a side thereof in a manner that the protruding panel 304 is configured with two recesses 305 at positions corresponding to the two sides thereof while having two fixing guides 306 to be disposed respectively at the edges of the two recesses 305. Moreover, there is at least one block being disposed on the second surface 301, which is substantially a protrusion 308 bulging out from the second surface that is positioned on the protruding panel 304. In addition, the block can be made of a hot melt material, which is known to those skilled in the art and thus will not be described further herein. In addition, the block can be the two seats 307 formed on the second surface at positions corresponding to the two recesses 305 in respective. In this embodiment, although each seat 307 is constructed as an L-shaped structure, it is not limited thereby. Moreover, the protrusion 308 and the seats 307 can exist at the same time on the second surface 301, or it is possible to have only one selected from the protrusion 308 and the seat 307 to be used as the block and exist on the second surface 301.

Figure 5A:
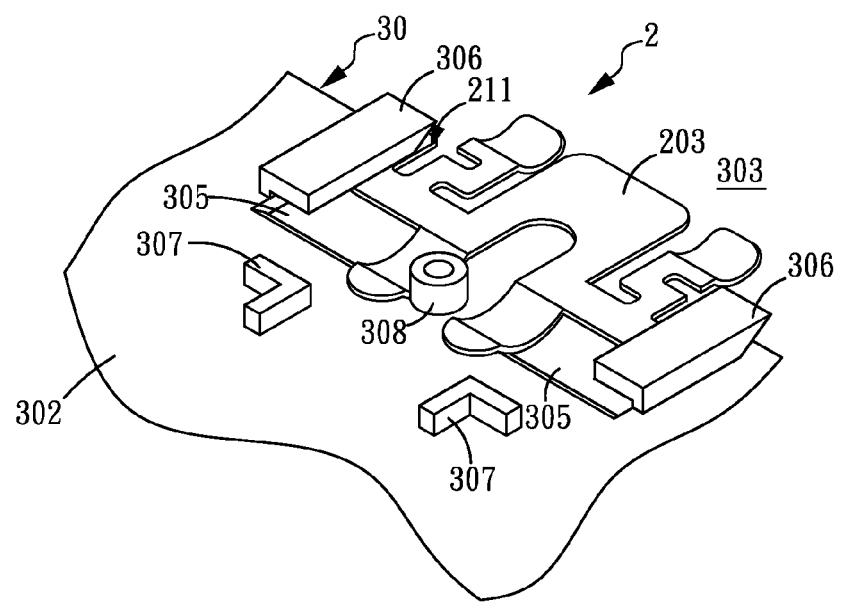
FIG. 5A is a schematic diagram showing how an anti-ESD plate of the present invention is sliding and locked upon a second surface of a housing.

The anti-ESD plate 2 is constructed for enabling the same to be capable of sliding and locked into a specific position on the second surface 301, and it can be constructed as the one shown in FIG. 2A, FIG. 3A, FIG. 3B, or FIG. 3C. The cover 31 is designed to be place on the first surface 300 at a position corresponding to the opening 303 for sealing the same. It is noted that the sealing of the opening 303 by the use of the cover 31 is performed by fixing the cover 31 on the housing 30 by screwing or the like Please refer to FIG. 5A, which is a schematic diagram showing how an anti-ESD plate of the present invention is sliding and locked upon a second surface of a housing. Taking the anti-ESD plate 2 shown in FIG. 2A for example, when the anti-ESD plate 2 is being forced to inset into the housing 30 gradually from the edge of the opening 303, the two press elements 311 formed at the two opposite sides thereof will engage respectively with the corresponding fixing guides 306 at the two sides of the recesses 305, during which as the surface relating to where the press elements 311 are contacting with the fixing guides 306 will be pressed by the fixing guides 306 due to its thickness so that it is slightly under the second surface, the fixing guides 306 are exerting a constant downward pressing force upon the press elements 211 during the sliding and locking of the anti-ESD plate 2.

Figure 5B:
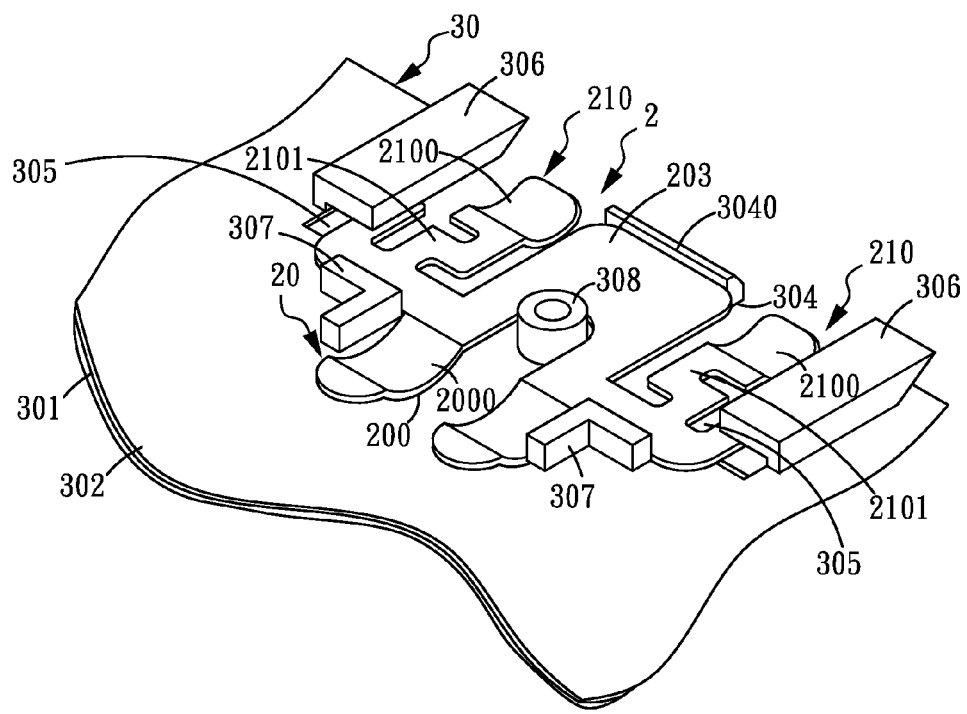
FIG. 5B and FIG. 5C are three-dimension diagrams showing an anti-ESD device of different viewing angles according to an embodiment of the present invention.
Figure 5C:
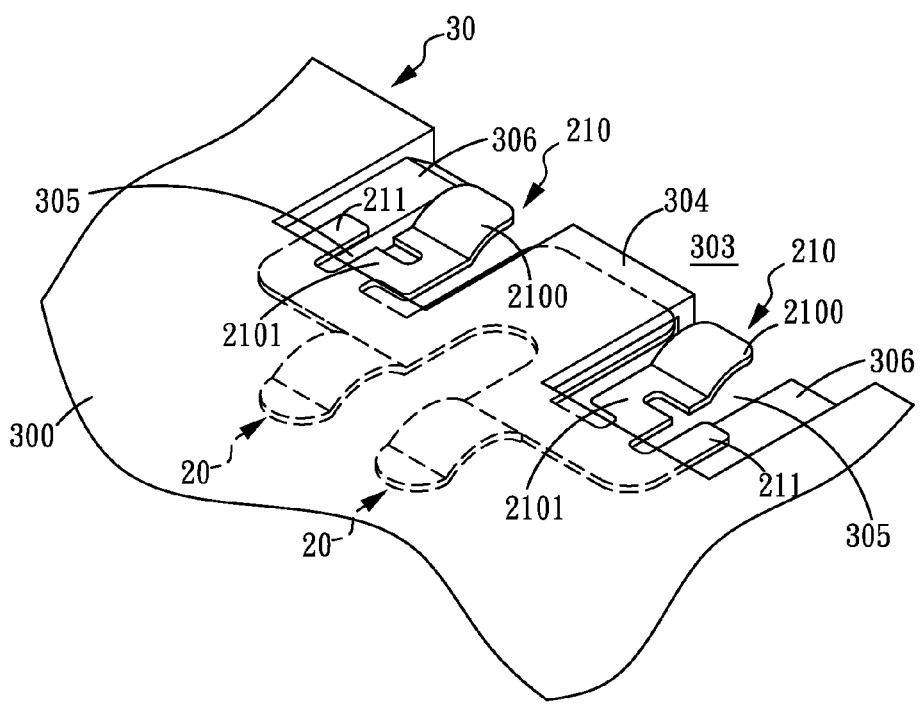

When the anti-ESD plate 2 is kept being pushed to move and inset into the housing 30, it will eventually being situated in a status as those shown in FIG. 5B and FIG. 5C. As shown in FIG. 5B and FIG. 5C, the first projection structure 2000 of the first conducting part 20 is engaged with the first conductive layer 302, whereas the edge of the anti-ESD plate 2 is arranged abutting against the seats 307 by that the anti-ESD can be fixedly stationed at a designated position and thus is prevented from any displacement or even rotation. When the anti-ESD plate 2 is fixedly stationed at the designated position, the inner end of the slot 201 will engage with the protrusion 308. Consequently, since the protrusion 308 is made of a heat melt material, it can be melt and used as a rivet for riveting the protruding panel 202 after curing, and thus fixing the anti-ESD plate 2 at the designated position. It is noted that there can be no such protrusion 308 or such slot 201 being formed in the aforesaid anti-ESD device 3, and also the protrusion 308 is not necessary to be made from a heat melt material, they can be selectively formed in the aforesaid anti-ESD device 3 according to actual requirement. In addition, as soon as the anti-ESD plate 2 is fixedly stationed, the extruding portion of the first conducting element 203 is placed on the surface of the protruding panel 304.

Figure 6:
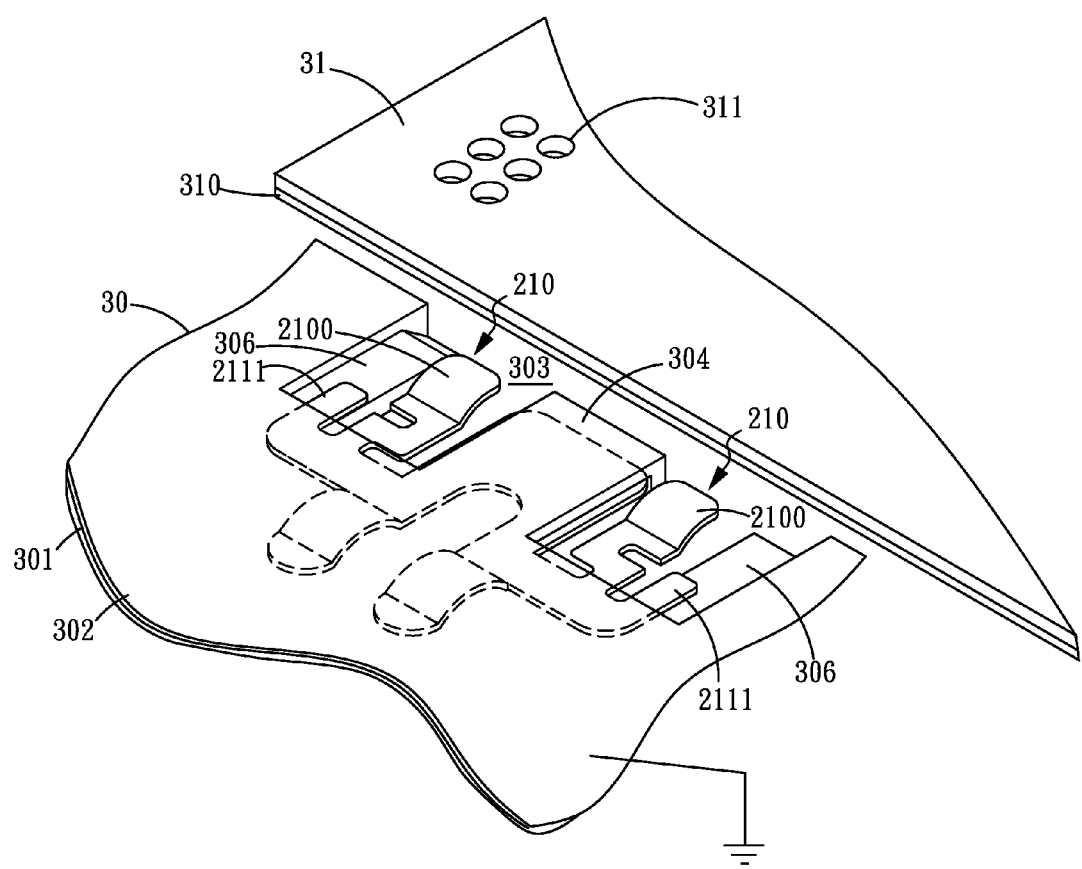
FIG. 6 is a schematic diagram showing an opening of an anti-ESD device being sealed by its cover according to an embodiment of the invention.

Since the protruding panel 304 further has a blocking panel 3040 protruding from an edge of its second surface 301, the sliding of the anti-ESD plate 2 is further being prevented since the blocking panel 3040 will be place abutting against a side of the extension 203. Moreover, when the anti-ESD plate 2 is fixedly stationed at the designated position, the two second conducting elements 210 of the second conducting part 21 will be received respectively in their corresponding recesses 305. By the use of the block structure which is composed of the seats 307, the protrusion 308, or the combination thereof, and the fixing guides as well, the anti-ESD plate 2 can be effectively fixed at the designated position. As shown in FIG. 6, after the anti-ESD plate 2 is fixed, the opening 303 can be sealed by the cover 31, and since there is a second conductive layer 310 formed on the cover 31 at a position corresponding to the second conducting part 210, the static electricity originated from a user or ambient environment that enters into the housing 30 through the holes 311 formed on the cover 31 can be guided by the second conductive layer 310 of the cover 31 to the anti-ESD plate 2 where it is further being guided to the first conductive layer 302 of the housing 30 and then to a ground terminal, by that any damage to the electronic devices in the housing 30 that is resulting from electrostatic discharge can be prevented.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. An anti-ESD plate, comprising:
 a first conducting part, configured with at least one projection structure; and
 at least two second conducting parts, the second conducting parts connected separately on two sides of the first conducting part and each of the second conducting parts further comprising:
  a second conducting element, configured with a second projection structure;
  a pressing element, disposed at a side of the second conducting element;
  wherein the pressing element is further comprised of a first panel and a second panel; the first panel is formed protruding outwardly from a side of the first conducting part while connecting to the second panel, an accommodation space is formed between the second panel and the first conducting part for receiving the corresponding second conducting part, the second conducting part is connected to a side of the first panel by a cantilever.

2. The anti-ESD plate of claim 1, wherein the first conducting part is further configured with a slot.

3. The anti-ESD plate of claim 2, wherein the slot is formed at a position for dividing the first conducting part into a pair of first conducting elements, the first conducting elements are symmetrical to each other, at least one first projection structure is formed on each of the two first conducting elements.

4. An anti-ESD device, comprising:

a housing, formed with a first surface and a second surface while enabling the second surface to be formed with a first conductive layer and at least one block, and the housing further having an opening, the opening to be formed with an protruding panel at a side thereof, the protruding panel configured with two recesses at positions corresponding to two sides thereof, two fixing guides to be disposed respectively at the edges of the two recesses;

an anti-ESD plate, further comprising: a first conducting part, being arranged on the second surface while abutting against the protruding panel; at least two second conducting parts, each of the second conducting parts connected to the first conducting part and configured with a second conducting element and a press element; and a cover, having a second conductive layer formed on a surface thereof;

wherein, the first conducting part is configured with at least one first projection structure that is arranged abutting against the first conductive layer; each second conducting element is further configured with a second projection structure, the second projection structure being arranged at a position corresponding to one of the two recesses; the press element is disposed at a side of the second conducting element while abutting against a side surface of the corresponding fixing guide so as to enable the anti-ESD plate to be fixed and positioned by the at least one block when the anti-ESD plate is disposed on the second surface; and the second conductive layer is enabled to contact with the second projection structure of the second conducting element when the cover is disposed at a position sealing the opening.

5. The anti-ESD device of claim 4, wherein the first conducting part is further configured with a slot, while the block is disposed on the second surface at a position on a pillar disposed on the protruding panel for enabling the slot of the first conducting part to abut against the pillar.

6. The anti-ESD device of claim 5, wherein the slot is formed at a position for dividing the first conducting part into a pair of first conducting elements that are symmetrical to each other, the first projection structure being formed on each of the two first conducting elements.

7. The anti-ESD device of claim 4, wherein the press element is further comprised of a first panel and a second panel; the first panel is formed protruding outwardly from a side of the first conducting part while connecting to the second panel by an end thereof so as to form an accommodation space by the enclosure of the second panel and the first conducting part to be used for receiving the second conducting part, while the second conducting part is constructed selected from the group consisting of: the second conducting part is connected to a side of the first panel by the use of a cantilever, and the second conducting part is connected to a side of the first conducting part by the use of a cantilever.

8. The anti-ESD device of claim 7, wherein the block is substantially a protrusion bulging out from the second surface while being arranged abutting against a side of the first panel.

9. The anti-ESD device of claim 4, wherein the protruding panel further comprising:

a blocking panel, protruding from an edge of the second surface.

* * * * *